United States Patent [19]
Hotta

[11] Patent Number: 5,562,993
[45] Date of Patent: Oct. 8, 1996

[54] SEMICONDUCTOR DEVICE WITH IDENTIFICATION INFORMATION

[75] Inventor: Yuji Hotta, Osaka, Japan

[73] Assignee: Nitto Denko Corporation, Osaka, Japan

[21] Appl. No.: 402,816

[22] Filed: Mar. 10, 1995

Related U.S. Application Data

[62] Division of Ser. No. 237,104, May 3, 1994, Pat. No. 5,521,034.

[30] Foreign Application Priority Data

May 7, 1993 [JP] Japan ................... 5-106952

[51] Int. Cl.⁶ .................................................. B32B 15/08
[52] U.S. Cl. ...................... 428/458; 428/195; 428/411.1; 428/473.5; 428/913; 283/81
[58] Field of Search ............... 428/195, 411.1, 428/488.4, 458, 473.5, 913, 914, 901; 283/107, 81

[56] References Cited

U.S. PATENT DOCUMENTS 4,598,038 7/1986 Ahne ........................................ 430/283
4,916,009 4/1990 Hino et al. ............................... 428/220
5,300,364 4/1994 Hase et al. .............................. 428/258

FOREIGN PATENT DOCUMENTS

| 0138768 | 5/1990 | European Pat. Off. . |
| 0502400 | 2/1992 | European Pat. Off. . |
| 2120042 | 5/1990 | Japan . |

OTHER PUBLICATIONS

Patent Abstracts of Japan, vol. 14, No. 255 (E-0935) May 31, 1990 & JP-A-02 076 250, Mar. 15, 1990.
Patent Abstracts of Japan, vol. 16, No. 332 (E-1236) Jul. 20, 1992 & JP-A-04 098 855, Mar 31, 1992.
Database WPI Section CH, Week 9024, Derwent Publication, Ltd., GB Class A85, AN 90-182506.

*Primary Examiner*—William A. Krynski
*Attorney, Agent, or Firm*—Sughrue, Mion, Zinn, Macpeak & Seas

[57] ABSTRACT

A semiconductor device comprising a substrate having an individual identification information recorded on the surface thereof, wherein the substrate comprises a metal foil and the individual identification information is formed by a polyimide resin.

1 Claim, 1 Drawing Sheet

SEMICONDUCTOR DEVICE WITH IDENTIFICATION INFORMATION

This is a divisional of application Ser. No. 08/237,104 filed May 3, 1994, now U.S. Pat. No. 5,521,034.

FIELD OF THE INVENTION

The present invention relates to an individual identification label which is utilized for the management of various kinds of individuals such as products, materials, etc.

BACKGROUND OF THE INVENTION

An individual identification label is a label prepared by recording a prescribed individual identification information on the surface of a substrate comprising a plastic film, etc., using patterns such as characters, numbers, bar codes, etc., and is used by adhering the same to an individual object.

In the management of individuals using this kind of label, the case sometimes occurs that the label cannot help using in a high temperature (e.g., from 200° to 300° C.) atmosphere, whereby an individual identification label having a heat resistance becomes necessary.

A label prepared by forming a heat-resistant resin layer comprising a polyimide resin or a polyamide resin containing a white pigment on the surface of a substrate comprising a polyimide film and forming thereon a black pattern showing an individual identification information with a heat-transfer ink has been practically used at present as the individual identification label having such a heat resistance.

However, the heat resistance of the ink used for the pattern-forming portion of the individual identification information is insufficient since in the above-described conventional individual identification label, there is a problem that it is difficult for the individual identification label to endure the use thereof for a long period of time under a high temperature atmosphere of from 200° to 300° C.

SUMMARY OF THE INVENTION

An object of the present invention is to overcome the above-described problem and to provide an individual identification label having an excellent heat resistance capable of sufficiently enduring the use thereof in a high temperature atmosphere for a long period of time.

It has now been found that the above object can be achieved by the present invention described hereinbelow.

That is, according to the present invention, there is provided an individual identification label having an individual identification information recorded on the surface of a substrate, wherein the substrate comprises a metal plate or a metal foil and the individual identification information is formed by a polyimide resin.

DETAILED DESCRIPTION OF THE INVENTION

Figure 1:
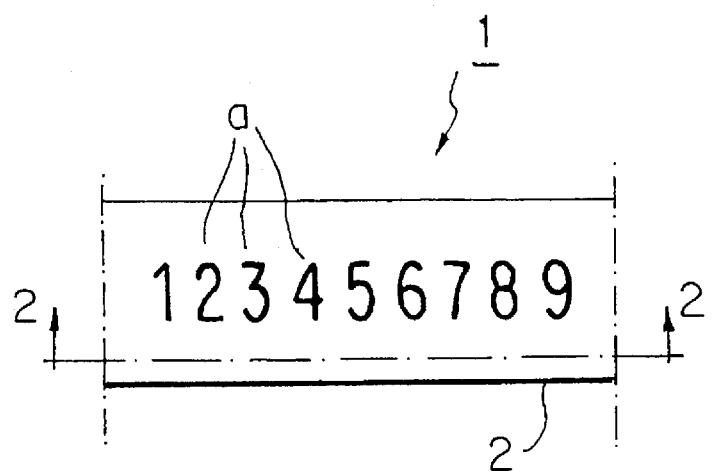
FIG. 1 is a plane view showing the individual identification label of the present invention shown in Example 1.

The present invention is described in detail below.

The thickness of the metal plate or foil constituting the substrate in the individual identification label of the present invention is from 3 μm to 10 mm, preferably from 5 to 300 μm, and more preferably from 5 to 50 μm.

The material for the substrate is copper, nickel, iron, aluminum, stainless steel, etc.

The surface of the metal plate or foil can be subjected to conventional various treatments (e.g., plating treatment) to improve the adhesion with a polyimide resin forming the individual identification information or improve the contrast, and to establish a metal surface gloss in the range of from 70 to 250% (measured according to JIS Z8741) or establish the average surface roughness thereof in the range of from 0.1 to 10 μm.

On the other hand, the conventional polyimide resin can be used as the polyimide resin forming the individual identification information in the present invention, but from the standpoint that the individual identification information can be easily formed on the surface of the metal plate or foil, the use of a photosensitive polyimide resin is particularly preferred. The examples of the photosensitive polyimide resin are a resin having a structural unit represented by formula (I):

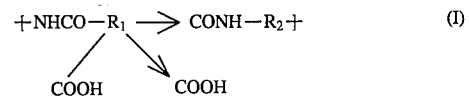

wherein the arrows each indicates a bond which can be substituted by isomerization, $R_1$ represents a tetravalent aromatic or aliphatic hydrocarbon residue, and $R_2$ represents a divalent aromatic or aliphatic hydrocarbon residue, a compound represented by formula (II):

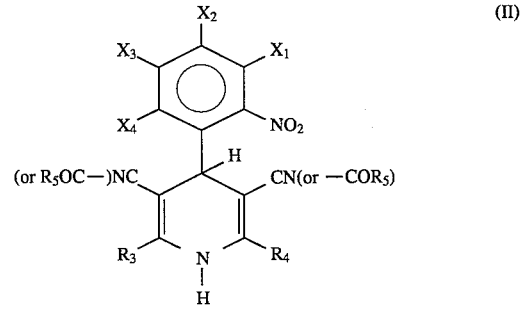

wherein $R_3$ and $R_4$ each represents hydrogen atom or an alkyl group having 1 to 3 carbon atoms, $R_5$ and $R_6$ each is one member selected from the group consisting of an alkyl group or an alkoxyl group having 1 to 4 carbon atoms, anilino group, toluidino group, benzyloxy group, amino group, and a dialkylamino group, and $X_1$ to $X_4$ each is one member selected from the group consisting of hydrogen atom, fluorine atom, nitro group, methoxy group, a dialkylamino group, amino group, cyano group, and a fluoroalkyl group, and a compound represented by formula (III):

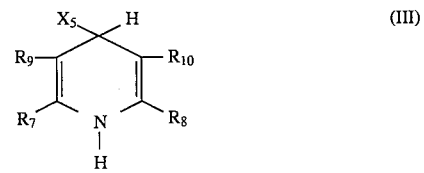

wherein $R_7$ and $R_8$ each represents hydrogen atom or an alkyl group having 1 to 3 carbon atoms, $R_9$ and $R_{10}$ each is one member selected from the group consisting of hydrogen atom, cyano group, acetyl group, amide group, and a group of the formula $COOR_{11}$ wherein $R_{11}$ is one member selected from the group consisting of an alkyl group or an alkoxyl group having 1 to 5 carbon atoms, anilino group, toluidino group, and benzyloxy group, and $X_5$ is one member selected from the group consisting of hydrogen atom, fluorine atom, an alkyl group having 1 to 3 carbon atoms, a fluoroalkyl group, and phenyl group.

The polyimide resin may further contain a pigment to increase the contrast with the substrate.

The thickness of the polyimide resin in the present invention is preferably from 0.1 to 30 μm.

Since the individual identification label of the present invention is used by adhering to the surface of an individual article, it is preferred to form a pressure-sensitive adhesive layer or adhesive layer on the metal plate or foil constituting the substrate at a side opposite the side on which the individual identification information is formed.

In this case, any conventional adhesives can be used as the adhesive, but from the standpoint that the object of the present invention is to provide an individual identification label capable of enduring the use under a high temperature atmosphere, for example, epoxy adhesives, silicone adhesives, imide adhesives or mixtures thereof, each having a heat resistance, are preferred. Further, any conventional pressure-sensitive adhesives can be used as the pressure-sensitive adhesive, but of those pressure-sensitive adhesives, acrylic pressure-sensitive adhesives, rubber pressure-sensitive adhesives, and silicone pressure-sensitive adhesives are preferably used.

The thickness of the adhesive layer or the pressure-sensitive adhesive layer is preferably from 5 to 50 μm.

According to the individual identification label of the present invention having the construction described above, the substrate comprises a metal plate or foil and the individual identification information recorded on the surface of the substrate is formed by a polyimide resin which is a heat-resistant resin. As a result, both the substrate and the individual identification information have a sufficient heat resistance. Accordingly, when the individual identification label of the present invention is used under a high temperature atmosphere of from 200° to 350° C. or is contacted with a heated iron plate, etc., the label does not deteriorate and it does not occur that reading of the individual identification becomes impossible.

The individual identification label of the present invention can be used to, for example, manage the production step of electronic parts such as a printed substrate. Further, other use of the individual identification label is as follows. In a semiconductor device obtained by sealing a semiconductor element in a plastic package, by utilizing that the substrate of the individual identification label comprises a metal plate or foil, the individual identification label is adhered onto the surface of the plastic package of the semiconductor element such that the individual identification label covers at least 50%, and preferably at least 80%, of the surface area of the plastic package, whereby a semiconductor device having excellent heat characteristic evaluated by a thermal cycle test (TCT) which is an accelerating test for evaluating the performance of the semiconductor-sealing resin, and also excellent anticracking property at immersing in a molten solder is obtained.

Thus, the individual identification label having excellent heat resistance capable of sufficiently enduring even in using under a high temperature atmosphere for a long period of time can be realized.

The present invention is described in more detail by the following examples.

EXAMPLE 1

Figure 2:
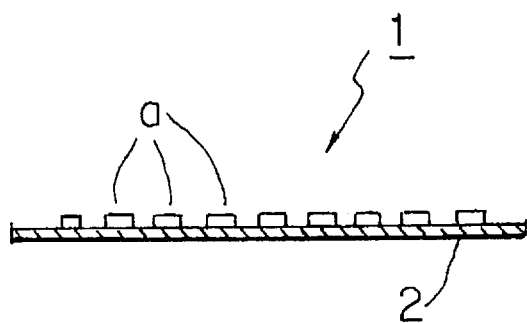
FIG. 2 is an enlarged cross sectional view of the individual identification label shown in FIG. 1.

In an individual identification label 1 shown in FIGS. 1 and 2, a substrate 2 is composed of a 30 μm thick stainless steel ("SUS 304" in JIS mark, and hereinafter the same) and an individual identification information (English characters and numbers in the Figures) a is recorded on the surface of the substrate 2. The individual identification information a is composed of a polyimide resin described below.

The individual identification label 1 was prepared as follows.

Biphenyltetracarboxylic acid dianhydrite was reacted with an almost equimolar amount of para-phenylenediamine in dimethylacetamide at the monomer concentrations of 20% by weight at room temperature for 24 hours to obtain a solution of a polyimide precursor represented by the following formula

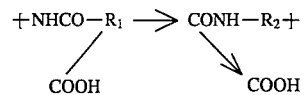

In 100 parts by weight (as solid content) of the polyimide precursor thus obtained was uniformly dissolved 30 parts by weight of a compound (hereinafter referred to "as o—NCN") represented by the following formula:

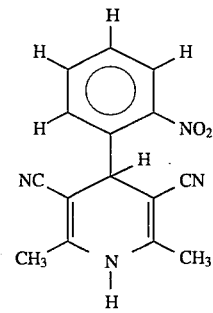

The solution thus obtained was coated on the surface of a 30 μm thick stainless steel (substrate) and pre-dried on a hot plate at 80° C. for 10 minutes to form a coating layer having a dry coating thickness of about 5 μm. Vacuum contact exposure was applied to the coating layer for 3 minutes through a mask having an individual identification information recorded thereon using an actinic light having a wavelength of 436 nm from a super high-pressure mercury lamp of 250 W with a glass filter at a distance of 30 cm from the light source.

After the light exposure, the exposed layer was dried at 185° C. for 10 minutes, developed with a developer composed of a 3% by weight aqueous solution of tetramethylammonium hydroxide and methyl alcohol (2/1 by volume ratio) for 4 minutes, and rinsed with water to obtain a negative-type pattern of the exposed portion only clearly remaining on the substrate.

When the pattern was imitated by heating to a high temperature (400° C.) for 2 hours, percentage of the remaining film thickness was about 75%. In addition, the finally obtained polyimide film was a brown film and the contrast of the pattern to the substrate sufficiently had various characteristics of a practical level.

When the individual identification label thus obtained was allowed to stand at a temperature of 300° C. for 1 hour, no particular deterioration was observed. Further, when the label was contacted with an iron plate heated to 350° C., no particular deterioration (e.g., image transfer) was observed.

This is considered to be based on that since in the individual identification label 1 constructed as described above, the substrate 2 comprises a stainless steel and also the individual identification information a recorded on the surface thereof is formed by the polyimide resin, the individual identification label has a sufficient heat resistance.

REFERENCE EXAMPLE 1

An epoxy resin composition was used and a semiconductor element was sealed in the epoxy resin package by transfer molding at 175° C. for 2 minutes and then post-curing at 175° C. for 5 hours. The package was a 80 pin quartered flat package (80 pin QFP, size 20 mm×14 mm×2 mm) and the die pad size was 8 mm×8 mm. An aluminum foil having a size of 18 mm×12 mm and a thickness of 7 μm was adhered to both the surfaces of the package through a silicone pressure-sensitive adhesive layer (thickness 15 μm) constituted by a silicone rubber and a silicone resin to obtain a semiconductor device.

REFERENCE EXAMPLE 2

By following the same procedure as in Reference Example 1 except that an epoxy adhesive constituted by bisphenol A and epichlorohydrin was used in place of the silicone pressure-sensitive adhesive, a semiconductor device was prepared. In addition, the thickness of the epoxy resin adhesive layer was 50 μm.

COMPARATIVE EXAMPLE

By following the same procedure as in Reference Example 1 except that the plastic package was not covered by the aluminum foil, a semiconductor device was prepared.

Each of the semiconductor devices obtained in Reference Examples 1 and 2 and the Comparative Example was subjected to the TCT (thermal cycle test) of −50° C./5 minutes and then 150° C./5 minutes (one cycle). Further, the same types of the samples were subjected to a test that after absorbing moisture by allowing to stand each semiconductor device in a tank kept at a constant temperature of 85° C. and a relative humidity of 85%, and the semiconductor device was immersed in a molten solder at 260° C. for 10 seconds.

The results obtained are shown in the Table below.

TABLE

|  |  | Reference Example 1 | Reference Example 2 | Comparative Example |
|---|---|---|---|---|
| Crack Occurrence Number in TCT Test (number/5 samples) | | | | |
| Cycle Number: | 1,000 | 0 | 0 | 2 |
|  | 2,000 | 0 | 0 | 4 |
|  | 3,000 | 1 | 1 | 5 |
| Crack Occurrence Number in Anti-Crack Test at Immersion in Molten Solder (number/5 samples) | | | | |
| Moisture Absorption Time: | 48 hrs. | 1 | 1 | 4 |
|  | 72 hrs. | 2 | 1 | 5 |
|  | 96 hrs. | 2 | 2 | 5 |

It can be seen from the results shown in the Table above that the semiconductor devices prepared in Reference Examples 1 and 2 do not substantially form cracks in the TCT and form less cracks at the immersion in the molten solder. On the other hand, it can be seen that the semiconductor device prepared in the Comparative Example forms many cracks in the TCT and also at the immersion of the molten solder. This shows that the sample of the Comparative Example is inferior to those of the Examples in the reliability.

EXAMPLE 2

A recording layer was formed on each of the semiconductor devices prepared in Reference Examples 1 and 2 using a polyimide photosensitive resin, and the recording layer was irradiated with light by a UV exposure method using a mask film to record an individual identification information. In this case, the gloss (JIS Z8741) of the surface of the aluminum foil was 100% and the surface roughness thereof was 0.25 μm. In each of the semiconductor devices prepared in Examples 2 and 3 thus recorded thereon the individual identification information, the individual identification information could be accurately identified.

While the invention has been described in detail and with reference to specific embodiments thereof, it will be apparent to one skilled in the art that various changes and modifications can be made therein without departing from the spirits and scope thereof.

What is claimed is:

1. A semiconductor device comprising a flat package in which at least 50% of a surface thereof is covered with a metal foil, wherein the metal foil has a thickness of from 3 to 50 μm and an average surface roughness of from 0.1 to 10 μm, and wherein an individual identification information is formed on the surface of the metal foil by a polyimide resin.

* * * * *